US012648388B2

(12) United States Patent
Chao et al.

(10) Patent No.: US 12,648,388 B2
(45) Date of Patent: Jun. 2, 2026

(54) SYSTEMS AND METHODS FOR METALLIC DEIONIZATION

(71) Applicant: Taiwan Semiconductor Manufacturing Co., Ltd., Hsinchu (TW)

(72) Inventors: Chih-Wei Chao, Hsinchu (TW); Shu-Yen Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 621 days.

(21) Appl. No.: 17/871,821

(22) Filed: Jul. 22, 2022

(65) Prior Publication Data

US 2022/0359188 A1     Nov. 10, 2022

Related U.S. Application Data

(62) Division of application No. 15/988,350, filed on May 24, 2018, now Pat. No. 11,742,196.

(51) Int. Cl.
| | |
|---|---|
| *H10P 72/00* | (2026.01) |
| *B08B 3/08* | (2006.01) |
| *H10P 70/00* | (2026.01) |

(52) U.S. Cl.
CPC .............. *H10P 70/15* (2026.01); *B08B 3/08* (2013.01); *H10P 72/0416* (2026.01); *B08B 2203/007* (2013.01)

(58) Field of Classification Search
CPC ........... B08B 3/04; B08B 3/045; B08B 3/047; B08B 3/048; B08B 3/08; B08B 3/10; B08B 3/14; B08B 2203/007; H01L 21/02052; H01L 21/67057; H01L 21/67253; H10P 70/15; H10P 72/0416; H10P 72/0604
See application file for complete search history.

(56) References Cited

U.S. PATENT DOCUMENTS

| | | | | |
|---|---|---|---|---|
| 6,214,129 | B1 * | 4/2001 | Nakaoka ................... | B08B 3/10 |
| | | | | 134/28 |
| 2001/0042715 | A1 | 11/2001 | Parekh | |
| 2002/0195125 | A1 | 12/2002 | Jung et al. | |
| 2003/0132193 | A1 | 7/2003 | Okamoto | |
| 2004/0134513 | A1 | 7/2004 | Lu | |
| 2006/0054181 | A1 | 3/2006 | Rayandayan | |
| 2007/0034530 | A1 | 2/2007 | Lin | |
| 2008/0295862 | A1 | 12/2008 | Iwamoto | |
| 2013/0193108 | A1 | 8/2013 | Zheng | |
| 2016/0254166 | A1 | 9/2016 | Huang | |

(Continued)

FOREIGN PATENT DOCUMENTS

| | | |
|---|---|---|
| CN | 107301960 A | 10/2017 |
| TW | 200735193 A | 9/2007 |

*Primary Examiner* — David G Cormier
(74) *Attorney, Agent, or Firm* — Eschweiler & Potashnik, LLC

(57) ABSTRACT

In an embodiment, a method includes: receiving a wafer from a first dilution tank; immersing the wafer in a deionization tank, wherein the deionization tank comprises a tank solution that comprises a deionizing solution; determining a metal ion concentration within the tank solution; performing remediation within the deionization tank in response to determining that the metal ion concentration is greater than a threshold value; and moving the wafer to a second dilution tank.

20 Claims, 5 Drawing Sheets

(56)                  References Cited

U.S. PATENT DOCUMENTS

| | | |
|---|---|---|
| 2016/0351412 A1 | 12/2016 | Lee |
| 2018/0079668 A1 | 3/2018 | Higuchi |
| 2018/0282862 A1 | 10/2018 | Umehara |
| 2019/0198356 A1 | 6/2019 | Higuchi |
| 2019/0273003 A1 | 9/2019 | Wang |
| 2019/0362962 A1 | 11/2019 | Chao |

* cited by examiner

106C

400

500

SYSTEMS AND METHODS FOR METALLIC DEIONIZATION

RELATED APPLICATION

This application is a division of U.S. patent application Ser. No. 15/988,350, filed May 24, 2018, the contents of which is incorporated herein.

BACKGROUND

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed to achieve these requirements and overcome obstacles during manufacturing. Controlling the conditions of processing wafers within chambers or tanks is an important part of semiconductor fabrication technology.

One of the important concerns of semiconductor fabrication technology is particles. Particles within process apparatus, such as chambers or wet benches, easily contaminate wafers processed therein. To avoid particle contamination, a downflow or an up flow is provided within the chamber. However, particles may still fall on surfaces of wafers and result in contamination of wafers. Operators or engineers may then manually adjust the tank, so as to keep the flow rate or pressure of the liquid within the tank within the desired specifications. Accordingly, conventional techniques to avoid particle contamination may require large amounts of overhead and expensive hardware, but still fail to produce satisfactory results. Therefore, conventional techniques to avoid particle contamination are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
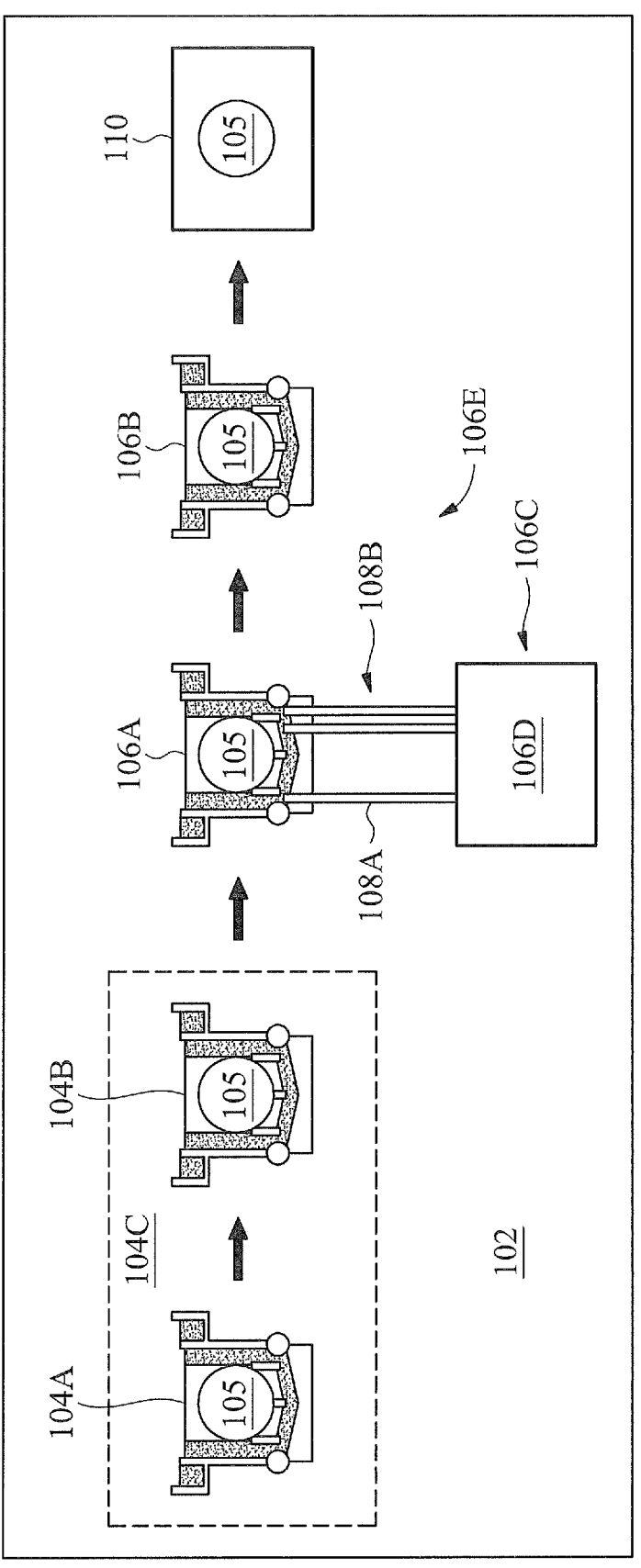
FIG. 1 is a block diagram of a wet cleaning tool, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Traditionally, wet bench based wafer cleaning using a wet cleaning tool may utilize a series of acid and dilution baths followed by a deionization and dilution bath using a deionization bath tank prior to being dried and removed from the wet cleaning tool. The dilution bath may include any solution that may be utilized for dilution of a wafer after prior submersion within a bath, such as a deionized water (DIW) solution. This deionization bath tank may include a solution for metallic deionization (e.g., removal of metal ions from wafers), also Waned as a deionizing solution, without any in situ adjustment or remediation to account for whether the deionization at the deionization bath tank has performed sufficient metallic deionization. Rather, metal ion contamination of wafers may be assessed after wafer cleaning (e.g., after a wafer has been dried). Should a wafer be contaminated by an excess of metal ions (e.g., excess metal ion deposition), the entire process of wet bench based wafer cleaning using the wet cleaning tool is typically repeated wholesale instead of specifically addressing the issue of insufficient metal deionization in the deionization bath.

Accordingly, the present disclosure provides various embodiments of automated regulation of a deionization bath tank for wafer cleaning. Instead of a wholesale repeat of wafer cleaning using a wet cleaning tool should a wafer have an excess of metallic ions, an automated in situ process of remediating for excess metal ions at the deionization bath may be performed in various embodiments.

In certain embodiments, the deionization bath tank may be configured to execute a process of deionization bath tank remediation. The deionization bath tank remediation process may include sampling the tank solution (e.g., the liquid within the deionization bath tank) to determine a metal ion concentration within the tank solution. As will be discussed further below, the tank solution may include a deionizing solution for metallic deionization (e.g., removal of metal ions from wafers). In certain embodiments, the deionizing solution may include: a hydrogen fluoride (HF) solution; an ammonium hydroxide and hydrogen peroxide ($NH_4OH+ H_2O_2$) solution; and a hydrochloric acid and hydrogen peroxide ($HCL+H_2O_2+H_2O$) solution. Accordingly, the tank solution may include the deionizing solution diluted with an amount of water. For example, in certain embodiments, one part deionizing solution may be diluted with five parts of water.

Sampling may be performed by utilizing a drain or other collector of the tank solution that may be interfaced with a metallic ion sensor. The metallic ion sensor may be any type of sensor for metallic ions, such as an x-ray analyzer. Various types of metallic ions may be detected, such as sodium (Na), magnesium (Mg), aluminum (Al), calcium (Ca), chromium (Cr), iron (Fe), cobalt (Co), nickel (Ni), copper (Cu), zinc (Zn), gold (Au), platinum (Pb), and potassium (K). Remediation may be performed based on the concentration of metal ions found within the tank solution. In certain embodiments, remediation may be performed when the concentration of metal ions exceeds (e.g., is greater than) a threshold value for a particular metal ion. An example of the threshold value may include: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum (Pb), and 0.3 ppm of potassium (K). In various embodiments, the threshold value may be set based on a statistical analysis from aggregated sensor data concerning metallic ion concentrations within the tank solution.

Remediation may be any type of automated process to reduce the concentration of metal ions within the deionization bath tank, in situ. In certain embodiments, remediation may include raising the concentration of the deionizing solution within the deionization bath tank. In further embodiments, remediation may include raising the temperature within the deionization thank. In yet further embodiments, both raising the temperature within the deionizing thank and raising the concentration of the deionizing solution within the deionization bath tank may be performed in remediation. This remediation may be performed for only one time (e.g., performed once/initially after a metallic ion threshold value has been exceeded) or may be performed iteratively multiple times until the metallic ion concentration is below the metallic ion threshold level. Stated another way, being performed iteratively multiple time may include being performed initially and then subsequently escalated should the metallic ion concentration not drop below the metallic ion threshold level after a period of time). The period of time may be set (e.g., constant) or variable among different iterations. For example, the period of time may increase or decrease with each iteration. The escalation may include increasing the concentration of the deionizing solution and/or increasing the temperature of the tank solution beyond the increase performed initially.

After remediation has been satisfactorily performed, the wafer may be transported from the deionizing tank to a dilution bath, and then subsequently to a drying chamber. In certain embodiments, a conventional final assessment of metal ion contamination (e.g., metal ion deposition on a wafer) may be performed after drying to see whether the entire process of wet bench based wafer cleaning using a wet cleaning tool, including the deionization process at the deionization bath tank, should be repeated.

FIG. 1 is a block diagram 100 of a wet cleaning tool 102, in accordance with some embodiments. The wet cleaning tool 102 may include various tanks 104A, 104B, 106A, and 106B. The tanks may include an acid bath set 104C of both the acid bath tank 104A and a dilution bath tank 104B. Although only a single acid bath set 104C is illustrated in the wet cleaning tool 102, any number of acid bath sets 104C may be utilized prior to the deionization bath tank 106A as desired for various application in accordance with various embodiments. For example, two or more acid bath sets 104C may be utilized in the wet cleaning tool 102 prior to the deionization bath tank 106A. The acid bath may include an acid solution for cleaning a wafer 105. The acid bath may be a conventional aspect of conventional wet cleaning tools and thus will not be discussed in detail herein for brevity. The dilution bath tank 106B may be a tank of deionized water (DIW) into which a wafer 105 may be immersed after immersion in the acid bath tank 104A. Although deionized water is specifically utilized for the dilution bath tank, any type of diluting solution may be utilized for the dilution bath tank as desired for different applications in various embodiments. For example, the dilution bath tank may include non-deionized water and not deionized water.

The deionization bath tank 106A may be part of an automated deionization bath tank system 106C. The deionization bank tank 106A may include a tank solution that may be sampled to determine a metal ion concentration within the tank solution. The tank solution may include a deionizing solution for metallic deionizing of the wafer 105. In certain embodiments, the deionizing solution may include: a hydrogen fluoride (HF) solution; an ammonium hydroxide and hydrogen peroxide ($NH_4OH+H_2O_2$) solution; and a hydrochloric acid and hydrogen peroxide ($HCL+H_2O_2+H_2O$) solution. Accordingly, the tank solution may include the deionizing solution diluted with an amount of water. For example, in certain embodiments, one part deionizing solution may be diluted with five parts of water.

The deionization bath tank system 106C may also include an analysis system 106D. The analysis system 106D may analyze the tank solution and control remediation of the tank solution based on the analysis, as will be discussed further below. The analysis system may be interfaced with the deionization bath tank 106A via at least one input interface 108A (e.g., pipe) that provides a sample of the tank solution for the analysis system 106D. Also, the analysis system may be interfaced with the deionization bank tank 106A via at least one output interface 108B that controls an aspect of the tank solution for remediation. For example, the output interface 108B may control at least one of a deionization solution concentration and/or temperature of the tank solution.

Similar to the acid bath set 104C, the deionization bath tank 106A may be part of a deionization bath tank set 106E that includes the deionization bath tank 106A and corresponding a dilution bath tank 106B. The dilution bath tank 106B may be a tank of deionized water (DIN) into which the wafer 105 may be immersed after immersion in the deionization bath tank 106A. Although deionized water is specifically utilized for the dilution bath tank, any type of diluting solution may be utilized for the dilution bath tank as desired for different applications in various embodiments. For example, the dilution bath tank may include non-deionized water and not deionized water.

As a final process of the a wet cleaning tool 102, the wafer 105 may be dried at a drying chamber. In certain embodiments, the drying may be performed by a conventional drying or evaporation chamber 110, and thus will not be discussed in detail herein.

Figure 2:
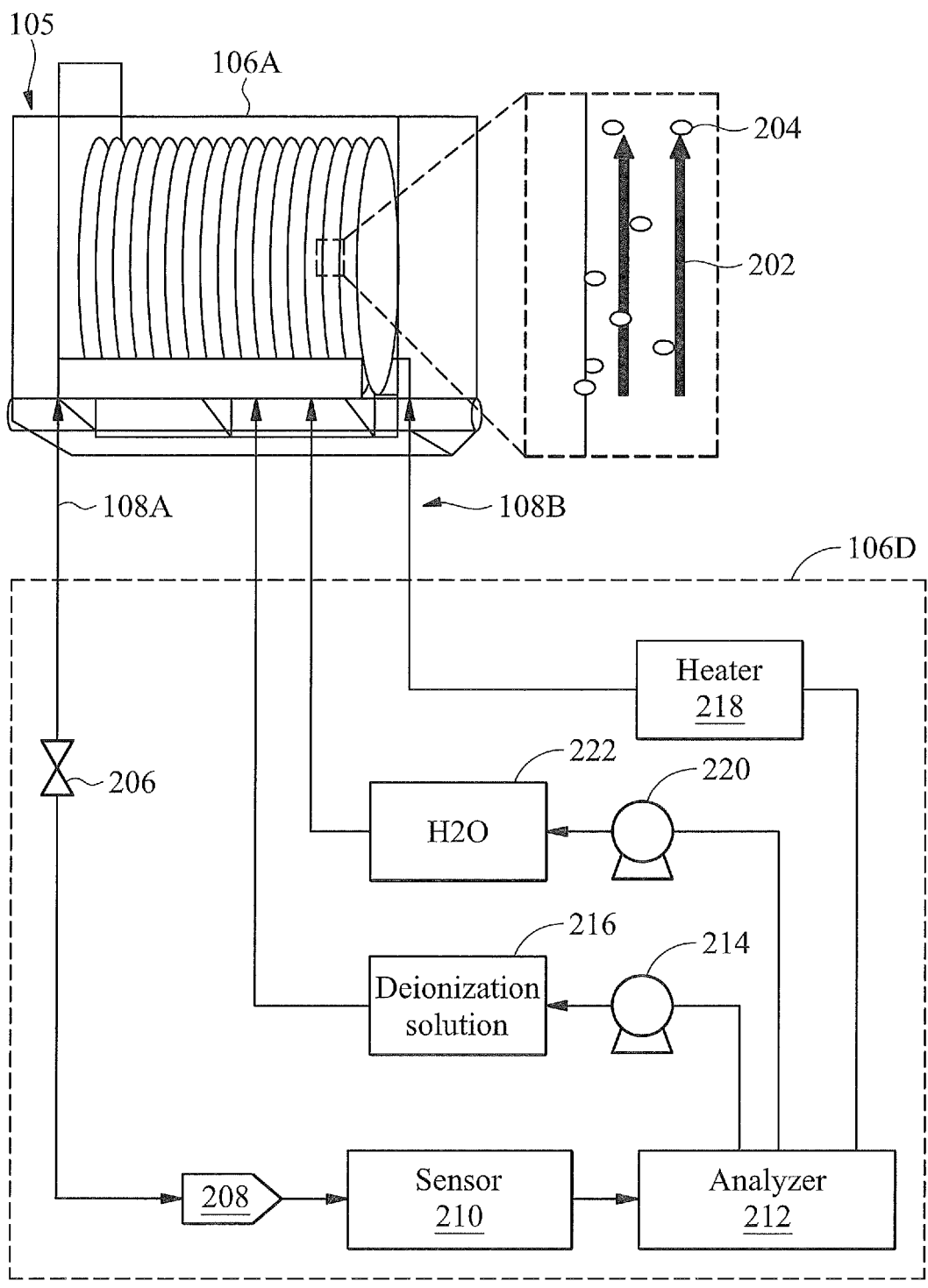
FIG. 2 is a block diagram of a deionization bath tank system, in accordance with some embodiments

FIG. 2 is a block diagram of the deionization bath tank system 106C, in accordance with some embodiments. As introduced above the deionization bath tank system 106C may include the deionization bath tank 106A, the analysis system 106D, the input interface 108A, and the output interfaces 108B. The wafer 105 is drawn in more detail as part of a batch of multiple wafers in this perspective view of the deionization bath tank 106A. As introduced above, to avoid particle contamination, a flow 202 may be provided within the deionization bath tank 106A to avoid metal ion particle 204 deposition (e.g., contamination) on the surface of the wafer 105. The flow may be provided by utilizing turbines or a pump to cause water circulation within the deionization bath tank 106A. The analysis system 106D may sample the tank solution from the deionization bath tank 106A by controlling a valve 206 that controls access of a collector 208 to the tank solution. A sensor 210 may be interfaced with the collector 208. The sensor (e.g., metallic ion sensor) may be configured to sample the tank solution to determine a concentration of metallic ions within the tank solution. In certain embodiments, the sensed concentration of metallic ions may be termed more simply as sensor data. As introduced above, the metallic ion sensor may be any type of sensor for metallic ions, such as an x-ray analyzer. Conventional metallic ion sensors may be utilized and thus will not be discussed in detail herein. Various types of metallic ions may be detected, such as sodium (Na), magnesium (Mg), aluminum (Al), calcium (Ca), chromium (Cr), iron (Fe), cobalt (Co), nickel (Ni), copper (Cu), zinc (Zn), gold (Au), platinum (Pb), and potassium (K).

The concentration of metallic ions as determined by the sensor 210 may be forwarded to an analyzer 212. The analyzer 212 may analyze whether the sensed concentration of metallic ions found within the tank solution exceeds a threshold value for a particular metal ion. As introduced above, an example of the threshold value may include: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum (Pb), and 0.3 ppm of potassium (K). In various embodiments, the threshold value may be set based on a statistical analysis from aggregated sensor data concerning metallic ion concentration within the tank solution as will be discussed further below.

The analyzer may control any of a variety of remediation processes based on whether the concentration of metallic ions found within the tank solution exceeds a threshold value for a particular metal ion. For example, the analyzer may control (via a valve or pump 214) an amount of deionization solution 216 to enter the tank solution via the output interface 108B. By controlling entry of an amount of deionization solution 216, the deionization bath tank system 106C may increase the concentration of the deionization solution 216 within the tank solution (e.g., by increasing the amount of deionization solution 216 for a same amount of tank solution). Also, the analyzer 212 may control a heater 218 that may heat the tank solution. For ease of discussion, the heater 218 is conceptually illustrated as part of the analysis system 106D where the heat may be transferred to the tank solution via the output interface 108B (e.g., representing thermal transfer). However, in other embodiments, the heater may be within the deionization bath tank 106A and in thermal communication with the tank solution (e.g., immersed within the tank solution) such that the analyzer 212 may control the heater 218 via the output interface 108B.

In certain embodiments analyzer may control (via a valve or pump 220) an amount of water 222 to enter the tank solution via the output interface 108B. Controlling (e.g., increasing) a concentration of water 222 within the tank may allow the tank to be flexibly set to any desired ratio of deionization solution 216 to water 222. For example, in certain embodiments the ratio of deionization solution 216 to water 222 may be reset to pre remediation levels either after or during remediation.

Figure 3:
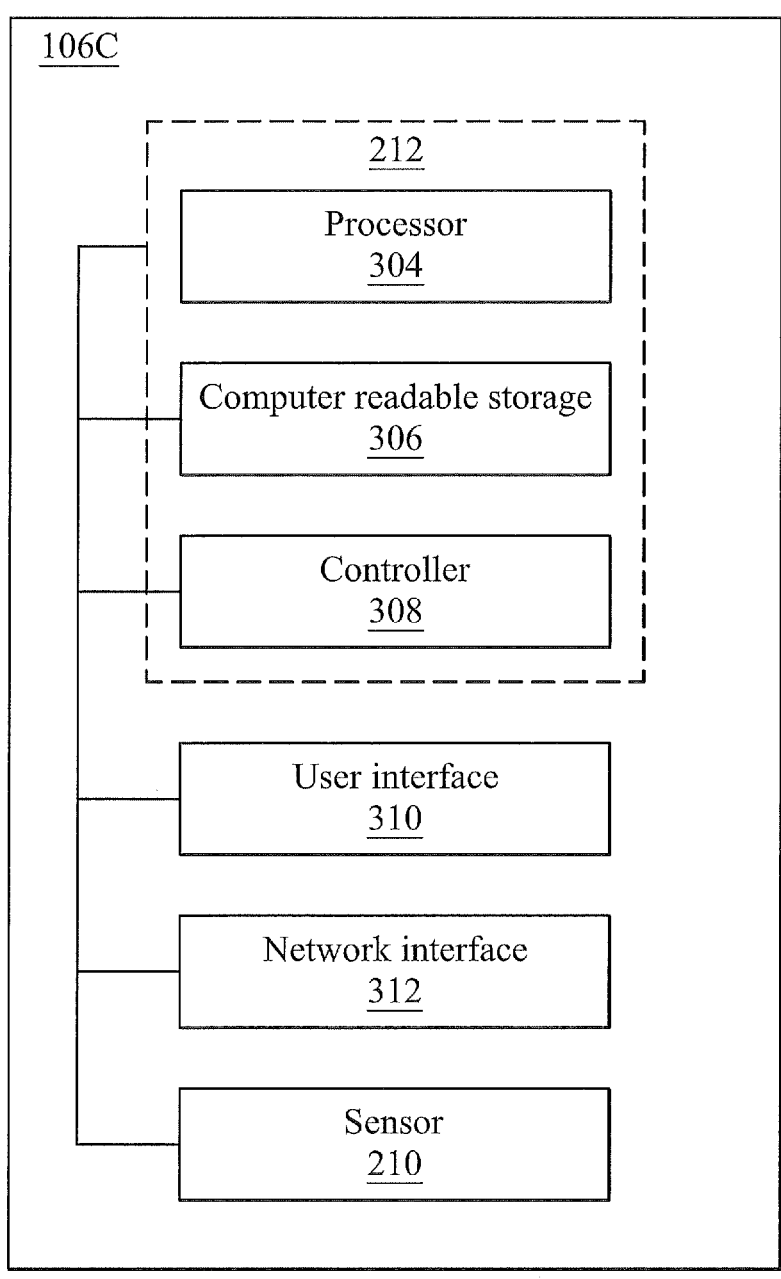
FIG. 3 is a block diagram of various functional modules of a deionization bath tank system, in accordance with some embodiment.

FIG. 3 is a block diagram of various functional modules of the deionization bath tank system 106C, in accordance with some embodiments. The deionization bath tank system 106C may also include various additional components (e.g., a deionization bath tank, pumps, collectors, and the like) that are discussed above but not illustrated in FIG. 3. The deionization bath tank system 106C may include a processor 304. In further embodiments, the processor 304 may be implemented as one or more processors.

The processor 304 may be operatively connected to a computer readable storage module 306 (e.g., a memory and/or data store), a controller module 308 (e.g., a controller), a user interface module 310 (e.g., a user interface), a network connection module 312 (e.g., network interface), and a sensor 210. In some embodiments, the computer readable storage module 306 may include deionization bath tank system logic that may configure the processor 304 to perform various processes discussed herein. The computer readable storage may also store data, such as sensor data collected by a metal ion sensor, identifiers for a wafer or a wafer batch, identifiers for a tank, identifiers for particular deionizing solutions, identifiers for a wet bench cleaning process, relationships between types of remediation (e.g., increase temperature and/or deionization solution concentration) and metal ion concentration thresholds, and any other parameter or information that may be utilized to perform the various processes discussed herein.

The deionization bath tank system 106C may include a controller module 308. The controller module 308 may be configured to control various physical apparatuses that control movement or functionality for a wafer and/or a tank solution, deionizing solution and/or heater. For example, the controller module 308 may be configured to control movement or functionality for at least one of a robotic arm that moves the wafer, a pump for a deionizing solution, a pump for water, a heater, and the like. For example, the controller module 308 may control a motor or actuator that may move or activate at least one of a robotic arm, a pump, and/or a heater. The controller may be controlled by the processor and may carry out aspects of the various processes discussed herein.

The deionization bath tank system 106C may also include the user interface module 310. The user interface module may include any type of interface for input and/or output to an operator of the deionization bath tank system 106C, including, but not limited to, a monitor, a laptop computer, a tablet, or a mobile device, etc.

The network connection module 312 may facilitate a network connection of the deionization bath tank system 106C with various devices and/or components of the deionization bath tank system 106C that may communicate (e.g., send signals, messages, instructions, or data) within or external to the deionization bath tank system 106C. In certain embodiments, the network connection module 312 may facilitate a physical connection, such as a line or a bus. In other embodiments, the network connection module 312 may facilitate a wireless connection, such as over a wireless local area network (WLAN) by using a transmitter, receiver, and/or transceiver. For example, the network connection module 312 may facilitate a wireless or wired connection with the sensor 210, the processor 304, the computer readable storage 306, and the controller 308.

The sensor 210 may be a sensor that may provide readings of a metal ion concentration within the tank solution. In certain embodiments, the sensor 210 may be an x-ray sensor. Metal ion concentration sensors are conventional and thus will not be discussed in detail herein. Also, the sensor data captured by the sensor 210 may be stored in the computer readable storage module 306 and compared to previously stored and/or future collected metal ion concentrations or sensor data. This aggregation of sensor data may be utilized in statistical analysis to determine outliers and/or threshold values utilizing conventional statistical methodologies.

With reference to FIGS. 2 and 3, the analyzer 212 of FIG. 3 and FIG. 2 may be a combination of the processor 304, computer readable storage 306, and the controller 308, as discussed above. These functionalities are separated in the block diagram of FIG. 3 to provide additional details concerning the analyzer 212 of FIG. 2.

Figure 4:
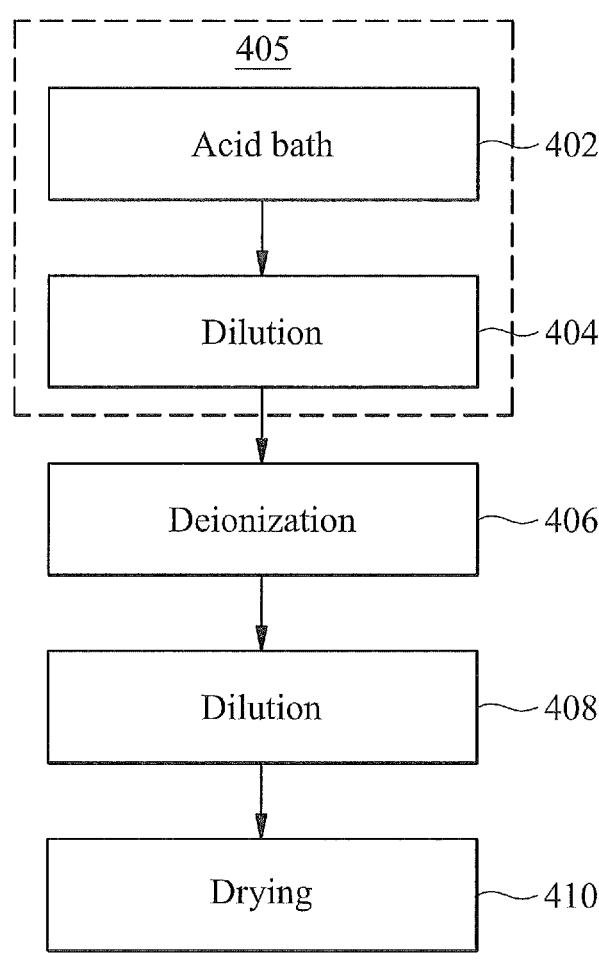
FIG. 4 is a flow chart of a wet cleaning tool process, in accordance with some embodiments.

FIG. 4 is a flow chart of a wet bench based wafer cleaning process 400, in accordance with some embodiments. The wet bench based cleaning process may be performed using the wet cleaning tool, introduced above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, a wafer may be immersed within an acid bath of an acid bath tank as part of the wet bench based wafer cleaning process 400. As introduced above, the wet cleaning tool may include an acid bath tank that may include an acid solution for cleaning a wafer. The acid bath may be a conventional aspect of conventional wet cleaning tools and thus will not be discussed in detail herein for brevity.

At operation 404, the wafer may be immersed within a dilution bath tank after operation 402. The dilution bath tank may be a tank of deionized water (DIW). Although deionized water may be utilized for the dilution bath tank, any type of diluting solution may be utilized for the dilution bath tank as desired for different applications in various embodiments. For example, the dilution bath tank may include water that is not necessarily deionized.

The combination of operations 402 and 404 may be referred to as an acid bath set 405. Although only a single acid bath set is illustrated in the process 400, any number of acid bath sets 405 may be utilized prior to immersion in the deionization bath tank, as will be detailed below, as desired for different application in accordance with various embodiments. For example, having multiple acid bath sets may involve repeating operations 402 and 404 as many times as desired for different sets of acid bath tanks and dilution bath tanks.

At operation 406, the wafer may be immersed within a deionization bath tank after completion of the acid bath set 405. The deionization bath tank 106A may include a tank solution that may be sampled to determine a metal ion concentration within the tank solution. The tank solution may include a deionizing solution for metallic deionization of the wafer 105. In certain embodiments, the deionizing solution may include: a hydrogen fluoride (HF) solution; an ammonium hydroxide and hydrogen peroxide (NH$_4$OH+ H$_2$O$_2$) solution; and/or a hydrochloric acid and hydrogen peroxide (HCL+H$_2$O$_2$+H$_2$O) solution. Accordingly, the tank solution may include the deionizing solution diluted with an amount of water. For example, in certain embodiments, one part deionizing solution may be diluted with five parts of water. As will be discussed in connection with FIG. 5, deionization may also include an automated regulation of a deionization bath tank for wafer cleaning.

At operation 408, the wafer may be immersed within a dilution bath tank after operation 406. The dilution bath tank may be a tank of deionized water (DIW). Although deionized water may be utilized for the dilution bath tank, any type of diluting solution may be utilized for the dilution bath tank as desired for different applications in various embodiments. For example, the dilution bath tank may include water that has not undergone deionization, as discussed above.

At operation 410, the wafer may be dried in preparation for exiting the wafer. The wafer may be dried at a drying chamber. In certain embodiments, drying may be performed by a conventional drying (e.g., evaporation) chamber, and thus will not be discussed in detail herein.

Figure 5:
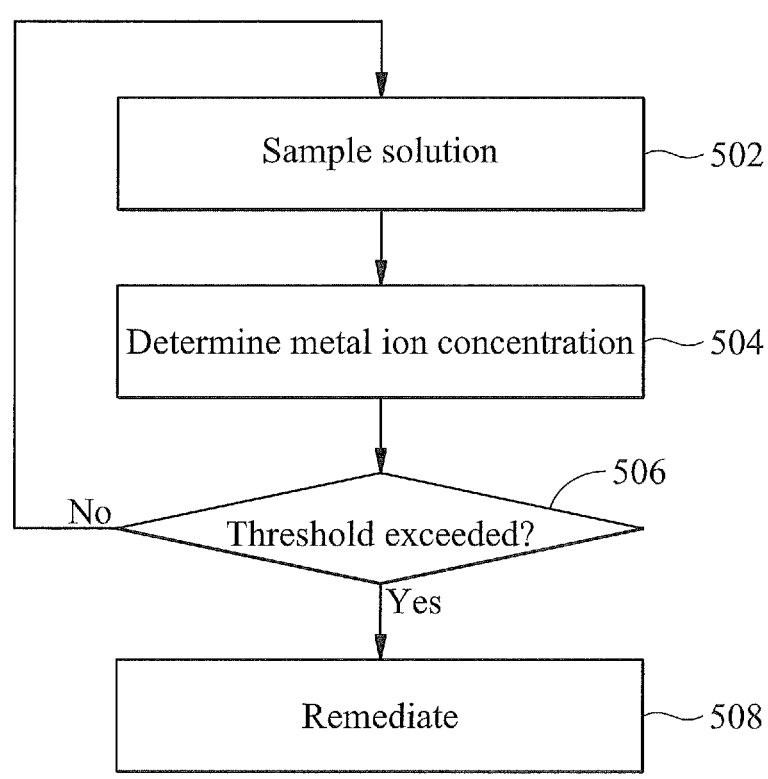
FIG. 5 is a flow chart of a deionization bath tank remediation process, in accordance with some embodiments.

FIG. 5 is a flow chart of a deionization bath tank remediation process 500, in accordance with some embodiments. The deionization bath tank remediation process 500 may be performed by a deionization bath tank system, which may be part of the wet cleaning tool introduced above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a sensor of the deionization bath tank system may sample tank solution from the deionization bath tank. Sampling may be performed by utilizing a drain or other collector of the tank solution that may be interfaced with a metallic ion sensor. The metallic ion sensor may be any type of sensor for metallic ions, such as an x-ray analyzer, as discussed above.

At operation 504, the sensor may determine a metal ion concentration of the deionization bath tank. Various types of metallic ions may be detected, such as sodium (Na), magnesium (Mg), aluminum (Al), calcium (Ca), chromium (Cr), iron (Fe), cobalt (Co), nickel (Ni), copper (Cu), zinc (Zn), gold (Au), platinum (Pb), and potassium (K), as discussed above At operation 506, an analyzer of the deionization bath tank system may determine whether a threshold is exceeded by the sensed metal ion concentration. If the threshold is not exceeded by the sensed metal ion concentration, the process may return to operation 502. If the threshold is exceeded by the sensed metal ion concentration, the operation may proceed to operation 508.

Further to operation 506, this threshold may be utilized to determine whether remediation is to be performed at the deionization bath tank. Stated another way, remediation may be performed when the concentration of metal ions exceeds a threshold value for a particular metal ion. An example of the threshold value may include: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum (Pb), and 0.3 ppm of potassium (K).

In various embodiments, the threshold value may be set based on a statistical analysis from aggregated sensor data concerning metallic ion deposition on wafers within the tank solution. For example, the collected sensor data may be analyzed over time from multiple iterations of determining the amount of resultant metallic ion depositions on wafers, as related to metallic ion concentration levels in the tank solution. For example, a dried wafer (e.g., after processing by the wet cleaning tool) may be analyzed for an amount of metallic ion depositions. Each value of the amount of metallic ion deposition may have a corresponding metallic ion concentration in the tank solution when the wafer was processed in the tank solution. Accordingly, a threshold value may be set as the metallic ion concentration in the tank solution corresponding to an amount of metallic ion depositions (e.g., after processing by the wet cleaning tool) that exceeds a desired amount.

At operation 508, an appropriate remediation may be performed based upon the particular threshold exceeded. For example, in certain embodiments, a single remediation action may be taken if any threshold is exceeded. In other embodiments, different remediation actions may be taken if different thresholds are exceeded. In additional embodiments, different remediation actions may be taken if thresholds related to different metal ions are exceeded. In further embodiments, different remediation actions may be taken based upon the amount that the thresholds are exceeded.

As introduced above, remediation may be any type of automated process to reduce the concentration of metal ions within the deionization bath tank in situ. In certain embodiments, remediation may include raising the concentration of the deionizing solution within the deionization bath tank. In further embodiments, remediation may include raising the temperature within the deionization thank. In yet further embodiments, both raising the temperature within the deionizing tank and raising the concentration of the deionizing solution within the deionization bath tank may be performed in remediation.

In certain embodiments, the deionization bath tank remediation process 500 may be repeated after a period of time and/or iterated continuously for a duration of time. Accordingly, the metal ion concentration may be continuously monitored and remediated if desired, until the metal ion concentration levels fall below threshold levels. For example, the deionization bath tank remediation process 500 may iterate after a period of time to perform remediation should the metallic ion concentration is not below a metallic ion threshold level. In certain embodiments, remediation may be performed initially and then subsequently escalated should the metallic ion concentration not drop below the metallic ion threshold level after the period of time. The period of time may be set (e.g., constant) or variable among different iterations. For example, the period of time may increase or decrease with each iteration. The escalation may include increasing the concentration of the deionizing solution and/or increasing the temperature of the tank solution beyond the increase performed initially.

In an embodiment, a method includes: receiving a wafer from a first dilution tank; immersing the wafer in a deionization tank, wherein the deionization tank comprises a tank solution that comprises a deionizing solution; determining a metal ion concentration within the tank solution; performing remediation within the deionization tank in response to determining that the metal ion concentration is greater than a threshold value; and moving the wafer to a second dilution tank.

In another embodiment, a method includes: immersing a wafer in a deionization tank, wherein the deionization tank comprises a tank solution that comprises a deionizing solution; determining a metal ion concentration within the tank solution; and performing remediation within the deionization tank in response to determining that the metal ion concentration is greater than a threshold value.

In another embodiment, a system includes: a deionization tank, wherein the deionization tank comprises a tank solution that comprises a deionizing solution, wherein the deionization tank is configured to support a wafer immersed within the deionizing solution; a dilution tank; a sensor configured to determine a metal ion concentration within the tank solution; and a control system configured to: perform remediation within the deionization tank in response to a determination that the metal ion concentration is greater than a threshold value; and move the wafer from the deionization tank into the dilution tank.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a deionization tank, wherein the deionization tank comprises a tank solution that comprises a deionizing solution, wherein the deionization tank is configured to support a wafer immersed within the deionizing solution;
a sensor configured to determine a metal ion concentration within the tank solution; and
a control system configured to perform remediation within the deionization tank until the metal ion concentration is equal to or less than a threshold value by:
performing a first iteration of remediation within the deionization tank in response to a first determination that the metal ion concentration is greater than the threshold value, wherein the first iteration of remediation achieves a second metal ion concentration within the tank solution; and
performing a second iteration of remediation within the deionization tank in response to a second determination that the second metal ion concentration is greater than the threshold value, wherein the first iteration of remediation and the second iteration of remediation have different escalations of deionization solution concentration, different escalations of temperature of the deionization tank, or different time frames.

2. The system of claim 1, wherein the deionizing solution is one of: a hydrogen fluoride solution; an ammonium hydroxide and hydrogen peroxide solution; and a hydrochloric acid and hydrogen peroxide solution.

3. The system of claim 1, wherein the control system is further configured to perform the remediation by increasing a concentration of the deionizing solution within the tank solution using a first pump of deionization solution and a second pump of water.

4. The system of claim 1, further comprising a heater configured to increase a temperature of the tank solution, wherein the control system is further configured to perform the remediation by increasing the temperature of the tank solution using the heater.

5. The system of claim 1, wherein the first iteration of remediation and the second iteration of remediation have different escalations of deionization solution concentration, different escalations of temperature of the deionization tank, and different time frames.

6. The system of claim 1,
wherein the first iteration of remediation comprises a first escalation of deionization solution concentration, a first escalation of temperature of the deionization tank, and a first time frame, wherein the first escalation of deionization solution concentration and the first escalation of the temperature of the deionization tank occur within the first time frame; and
wherein the second iteration of remediation comprises a second escalation of deionization solution concentration, a second escalation of a temperature of the deionization tank, and a second time frame, wherein the second escalation of deionization solution concentration and the second escalation of the temperature of the deionization tank occur within the second time frame, wherein:
the second escalation of deionization solution concentration, the second escalation of a temperature of the deionization tank, and the second time frame are respectively greater than the first escalation of deionization solution concentration, the first escalation of a temperature of the deionization tank, and the first time frame and
wherein the control system repeats the second iteration until the metal ion concentration is equal to or less than the threshold value.

7. The system of claim 1, where the threshold value comprises at least one of: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum, and 0.3 ppm of potassium (K).

8. The system of claim 1, wherein the sensor is configured to determine a plurality of concentrations corresponding to a plurality of metal ions, wherein the each of the plurality of metal ions comprise a different elemental identity, and wherein the threshold value is one of a plurality of threshold values corresponding to the plurality of metal ions.

9. A system comprising:
a first dilution tank configured to receive a wafer therein;
a deionization tank comprises a tank solution that comprises a deionizing solution, the deionization tank configured to receive the wafer therein;
at least one x-ray sensor configured to detect an elemental identity of a metal ion within the tank solution and measure a concentration of the metal ion;
a computer-readable storage medium storing a plurality of threshold values individually corresponding to maximum concentration values of metal ions of different elemental identities, and storing relationships between a plurality of iterations of a remediation process and the plurality of threshold values that individually correspond to one of the plurality of iterations; and at least one processor, coupled to the at least one x-ray sensor and the computer-readable storage medium, wherein the at least one processor is configured to:

determine whether the concentration of the metal ion within the tank solution exceeds a threshold value of the plurality of threshold values that comprises a same elemental identity as the metal ion;

perform a first iteration of the remediation process that corresponds to the threshold value of the plurality of threshold values if the threshold value of the plurality of threshold values is exceeded; and perform an escalation within a second iteration of the remediation process if the concentration of the metal ion does not drop below the threshold value of the plurality of threshold values after a predetermined period of time, wherein the escalation comprises at least one of increasing a period of time of the second iteration of the remediation process, increasing a concentration of the deionizing solution, and increasing a temperature of the tank solution.

10. The system of claim 9, wherein the deionizing solution is one of: a hydrogen fluoride solution; an ammonium hydroxide and hydrogen peroxide solution; and a hydrochloric acid and hydrogen peroxide solution.

11. The system of claim 9, further comprising a second dilution tank configured to receive the wafer therein from the first dilution tank.

12. The system of claim 9, further comprising:

an acid bath configured to receive the wafer therein, wherein the first dilution tank is configured to receive the wafer from the acid bath.

13. The system of claim 9, wherein the plurality of threshold values comprises at least one of the following: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum, and 0.3 ppm of potassium (K).

14. The system of claim 9, wherein the plurality of threshold values are determined by utilizing statistical analysis of an aggregation of x-ray sensor data, wherein the aggregation of x-ray sensor data is stored in the computer-readable storage medium and comprises previously stored x-ray sensor data.

15. A system comprising:

an acid bath configured to receive at least one wafer therein;

a first dilution tank configured to receive therein the at least one wafer from the acid bath;

a deionization tank comprises a tank solution that comprises a deionizing solution, the deionization tank configured to receive the at least one wafer therein, wherein the deionizing solution is one of: a hydrogen fluoride solution, an ammonium hydroxide and hydrogen peroxide solution, and a hydrochloric acid and hydrogen peroxide solution;

a computer-readable storage medium storing:

a first threshold value for a maximum concentration value of a first metal ion present in the deionization tank, a second threshold value for a maximum concentration value of a second metal ion present in the deionization tank, wherein the first metal ion has a different material than the second metal ion, a relationship between a first remediation process and the first threshold value, and a relationship between a second remediation process and the second threshold value;

at least one sensor configured to measure a first metal ion concentration within the tank solution and a second metal ion concentration within the tank solution; and at least one processor, coupled to the at least one sensor and the computer-readable storage medium, wherein the at least one processor is configured to:

determine whether the first metal ion concentration within the tank solution and the second metal ion concentration within the tank solution exceed the first threshold value and second threshold value respectively;

perform the first remediation process if the first threshold value is exceeded, wherein the first remediation process is performed iteratively for a plurality of iterations;

perform the second remediation process if the second threshold value is exceeded, wherein the second remediation process is performed iteratively for a plurality of iterations;

perform a first escalation of the first remediation process if the first metal ion concentration does not drop below the first threshold value after a predetermined period of time, wherein the first escalation comprises at least one of increasing a period of time of each iteration of the first remediation process, increasing a concentration of the deionizing solution, and increasing a temperature of the tank solution; and perform a second escalation of the second remediation process if the second metal ion concentration does not drop below the second threshold value after a predetermined period of time, wherein the second escalation comprises at least one of increasing a period of time of each iteration of the second remediation process, increasing a concentration of the deionizing solution, and increasing a temperature of the tank solution.

16. The system of claim 15, wherein the deionizing solution comprises a hydrochloric acid and hydrogen peroxide solution.

17. The system of claim 15, further comprising a second dilution tank configured to receive the at least one wafer therein from the first dilution tank.

18. The system of claim 15, wherein the first threshold value and the second threshold value comprise at least one of the following: 0.65 parts per million (ppm) of sodium (Na), 0.4 ppm of magnesium (Mg), 0.9 ppm of aluminum (Al), 0.6 ppm of calcium (Ca), 0.2 ppm of chromium (Cr), 0.4 ppm of iron (Fe), 0.1 ppm of cobalt (Co), 0.2 ppm of nickel (Ni), 0.1 ppm of copper (Cu), 0.3 ppm of zinc (Zn), 0.1 ppm of gold (Au), 0.1 ppm of platinum, and 0.3 ppm of potassium (K).

19. The system of claim 15, further comprising a heater configured to increase a temperature of the tank solution.

20. The system of claim 15, wherein the first dilution tank comprises deionized water.

* * * * *